United States Patent
Krause et al.

(10) Patent No.: US 7,804,378 B2
(45) Date of Patent: Sep. 28, 2010

(54) METHOD AND APPARATUS FOR PULSE WIDTH MODULATION

(75) Inventors: Uwe Krause, Pattensen (DE); Uwe Nolte, Barsinghausen (DE); Jan Spannberger, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 227 days.

(21) Appl. No.: 12/008,004

(22) Filed: Jan. 8, 2008

(65) Prior Publication Data

US 2008/0164958 A1   Jul. 10, 2008

(30) Foreign Application Priority Data

Jan. 9, 2007   (DE) .................. 10 2007 001 389

(51) Int. Cl.
*H02M 3/156* (2006.01)
*H03K 7/08* (2006.01)

(52) U.S. Cl. .................. 332/109; 327/175; 323/351

(58) Field of Classification Search ......... 329/109–111; 323/349–351; 327/175–177
See application file for complete search history.

(56) References Cited

U.S. PATENT DOCUMENTS

| 4,772,996 A | 9/1988 | Hanei et al. |
| 7,049,784 B2 * | 5/2006 | Suzuki ....................... 318/636 |

FOREIGN PATENT DOCUMENTS

DE   102 48 375 A1   5/2003

* cited by examiner

*Primary Examiner*—David Mis

(57) ABSTRACT

There is described a method and an apparatus for pulse width modulation with a predefined switching period having an adjustable ratio of the switch-on duration to the switch-off duration, in which a quantized signal is converted into a pulse-width-modulated signal and is generated in the form of a discrete pulse sequence of switch-on operations and switch-off operations with the predefined switching period, the switching edge for the switch-on duration and/or the switch-off duration being determined on the basis of the ratio of the switch-on duration to the switch-off duration.

20 Claims, 3 Drawing Sheets

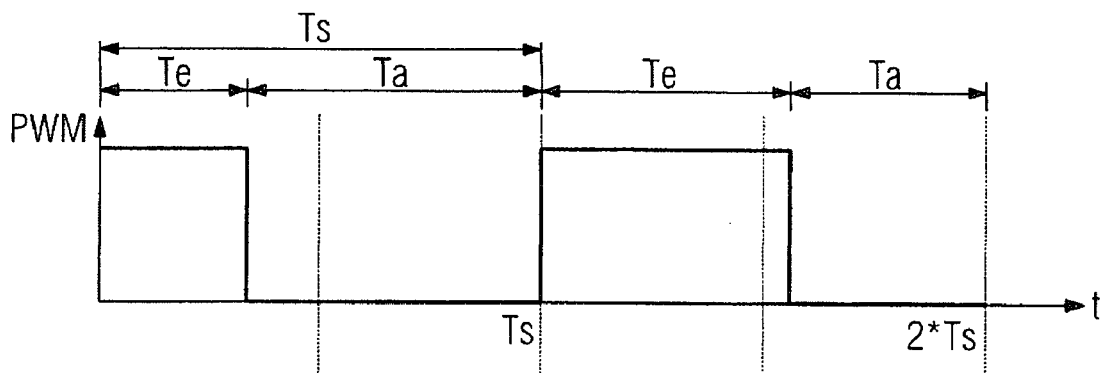
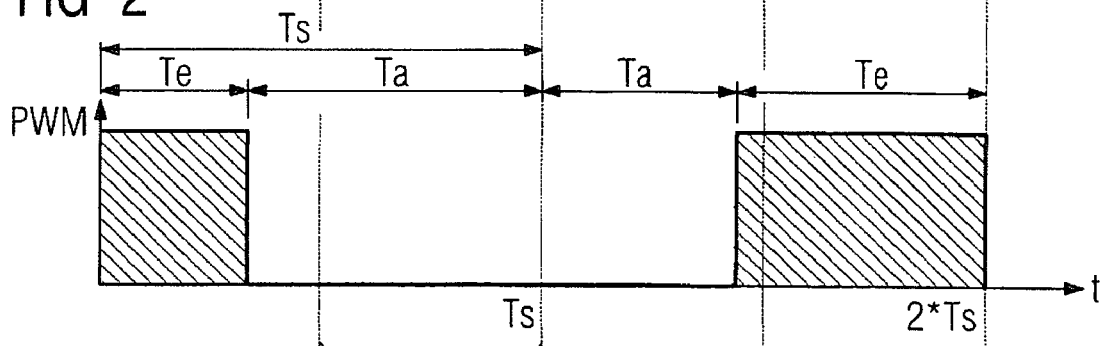
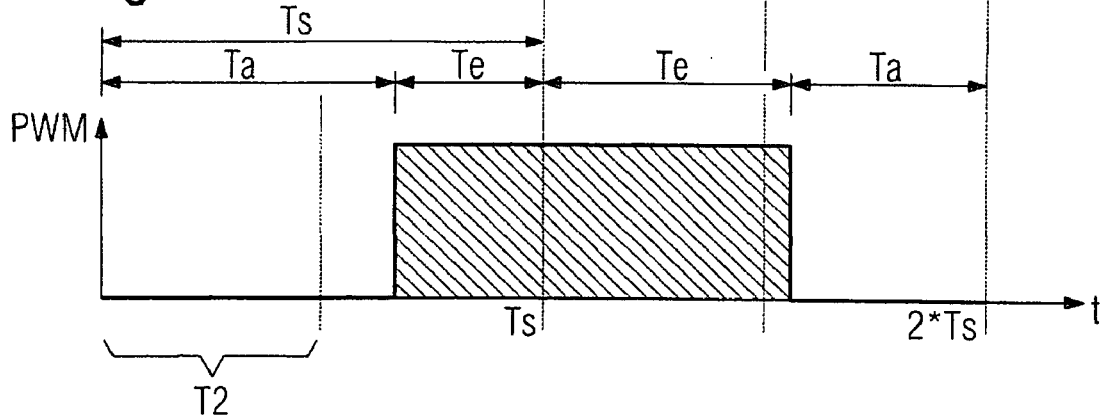

Te1=Te2=Te/2

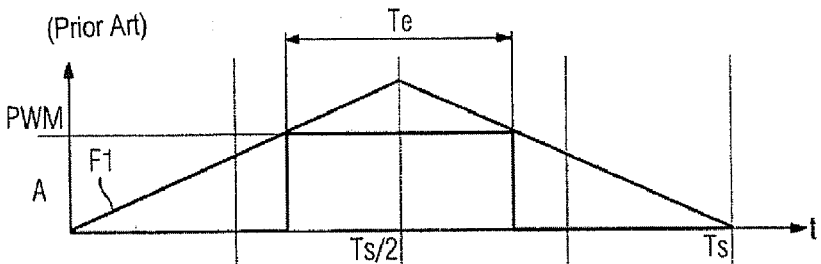
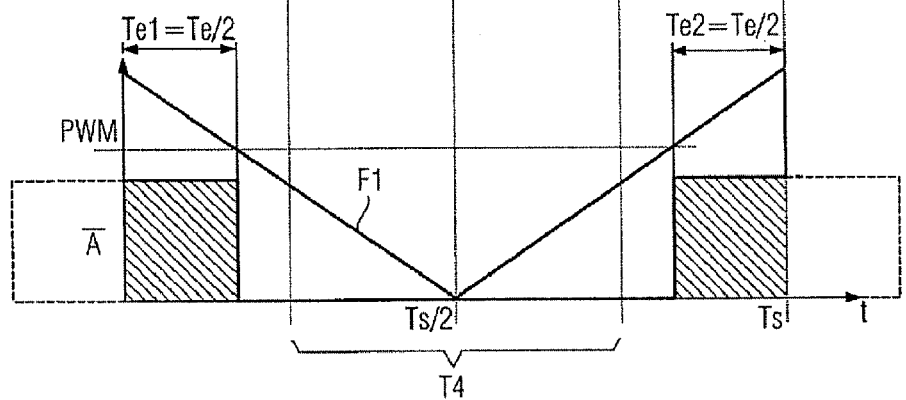
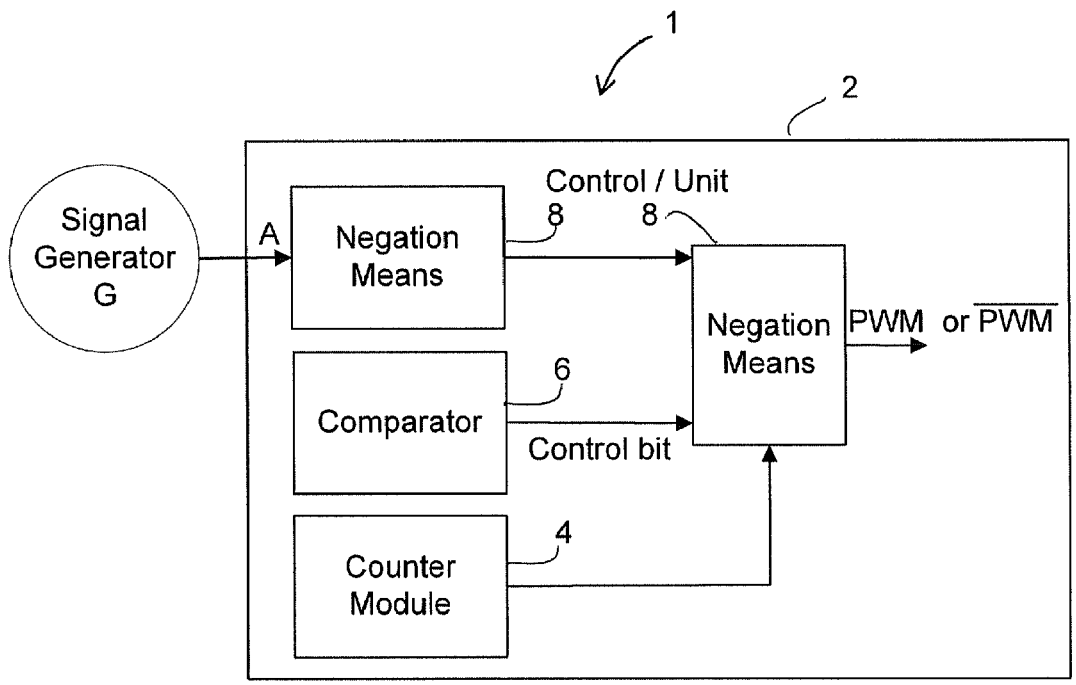
FIG. 6

METHOD AND APPARATUS FOR PULSE WIDTH MODULATION

CROSS REFERENCE TO RELATED APPLICATIONS

This application claims priority of German application No. 10 2007 001 389.4 DE filed Jan. 9, 2007, which is incorporated by reference herein in its entirety.

FIELD OF INVENTION

The present invention relates to a method and an apparatus for pulse width modulation, in which a quantized signal is converted into a pulse-width-modulated signal.

BACKGROUND OF INVENTION

The method is used, in particular, in power electronics when operating electrical machines, for example a three-phase machine or an inverter. These electrical machines have the same feature that, for example, an electrical AC voltage which has been generated and is averaged over the duration of one switching period (also referred to as a switching cycle) follows a predefined desired value. In this case, pulse width modulation is used to convert the desired value into a pulse-width-modulated square-wave signal comprising a corresponding binary switching command sequence or a discrete pulse sequence of switch-on operations and switch-off operations.

In this case, the switching command sequence determined, in particular the switch-on operations, may result in interference in this period of time, which interference influences the detection of electrical and non-electrical measurement variables, for example. On account of the variable duty ratio of the switch-on duration to the switch-off duration of the switch-on operations and switch-off operations, largely error-free measurement of electrical and non-electrical measurement variables without restricting the modulation range is possible only with increased complexity.

SUMMARY OF INVENTION

Therefore, an object of the invention is to specify a method and an apparatus for pulse width modulation, in which it is possible to detect measured values largely without interference and without restricting the modulation range.

According to the invention, the object is achieved, as regards the method, by means of the features of an independent claim 1 and, as regards the apparatus, by means of the features of a further independent claim.

The subclaims relate to advantageous developments of the invention.

In the inventive method for pulse width modulation with a predefined switching period having an adjustable duty ratio of the switch-on duration to the switch-off duration, a quantized signal is converted into a pulse-width-modulated signal and is generated in the form of a discrete pulse sequence of switch-on operations and switch-off operations with the predefined switching period, the switching edge for the switch-on duration and/or the switch-off duration being determined on the basis of the duty ratio of the switch-on duration to the switch-off duration. As a result of the fact that the switching edge(s) for the switch-on duration and/or the switch-off duration is/are determined on the basis of the determined duty ratio of the switch-on duration to the switch-off duration, the resultant pulse sequence of switch-on and switch-off operations comprises periods of time which are reliably free of switching. In addition, these switching-free periods of time preferably always occur at the same time within the switching period. Measured values can thus be detected without interference in these reliably switching-free periods of time within the switching period.

In one possible embodiment, the switching edge of the switch-on duration is set at the start of the switching period if the duty ratio of the switch-on duration to the switch-off duration is less than 1. In other words, if the switch-on duration is shorter than the switch-off duration, the switching edge of the switch-on duration is set at the start of the switching period. Alternatively or additionally, the switching edge of the switch-off duration can be set at the end of the switching period if the duty ratio of the switch-on duration to the switch-off duration is less than 1.

In another embodiment, the switching edge of the switch-on duration can be set at the end of the switching period and/or the switching edge of the switch-off duration can be set at the start of the switching period if the duty ratio of the switch-on duration to the switch-off duration is greater than 1. If, for example, the switch-on duration is longer than the switch-off duration, the switching edge of the switch-on duration is set at the start and/or the switching edge of the switch-off duration is set at the end.

Alternatively or additionally, the duration of the switch-on duration can be replaced with the duration of the switch-off duration. Alternatively or additionally, the duration of the switch-off duration can also be replaced with the duration of the switch-on duration.

In another alternative embodiment, the switching edge for the switch-on duration and/or the switch-off duration can preferably be determined by negating the binary output and simultaneously interchanging the switch-off operations and switch-on operations generated within the switching period.

At least two switch-on durations, whose switching edges are set at the start and at the end of the switching period, are preferably predefined within the switching period in the case of symmetrical pulse width modulation. As a result, the middle of the switching period, in particular, is free of switching times, thus making it possible to detect measured values without interference and, if appropriate, without errors. In this case, a reference signal on which the symmetrical pulse width modulation is based is expediently predefined as a signal which falls from the start of the switching period to the middle of the switching period and rises from the middle of the switching period to the end of the switching period. In one preferred embodiment, a counter signal is used as the reference signal.

As regards the apparatus for pulse width modulation, said apparatus comprises a control unit which is designed in such a manner that it converts a quantized signal into a pulse-width-modulated signal and generates the latter in the form of a discrete pulse sequence of switch-on operations and switch-off operations with the predefined switching period, the switching edge for the switch-on time being able to be determined on the basis of the duty ratio of the switch-on duration to the switch-off duration. In this case, depending on the manner in which the switching edges of the switch-on duration and/or the switch-off duration are determined, the control unit comprises suitable components, for example signal generators, comparators, negation means and/or counters.

The advantages achieved with the invention are, in particular, that periods of time which are reliably kept free of switching times are made possible as a result of the switching edges of the switch-on duration and/or the switch-off duration being shifted within the predefined switching period. In particular, this is possible for at least 50% of the period over the entire switching period. This makes it possible, for example, to detect electrical and non-electrical measurement variables largely without interference, that is to say without interference arising as a result of switching operations, within the switching-free periods of time in any desired systems and devices with pulse width modulation. In addition, the operations of detecting measured values can always be carried out at the same time within the switching period of the pulse width modulation and can thus be carried out in synchronism.

BRIEF DESCRIPTION OF THE DRAWINGS

Exemplary embodiments of the invention are explained in more detail using a drawing, in which:

FIG. 1 shows a timing diagram of a discrete sequence of switch-on and switch-off operations of a pulse-width-modulated signal in the prior art, FIG. 2 shows a timing diagram of a discrete sequence of switch-on and switch-off operations of a pulse-width-modulated signal, in which the switching edge of the switch-on duration has been shifted to the start of the switching period, FIG. 3 shows a timing diagram of a discrete sequence of switch-on and switch-off operations of a pulse-width-modulated signal, in which the switching edge of the switch-on duration has been shifted to the end of the switching period, FIGS. 5A to 5B show a plurality of timing diagrams of a discrete sequence of switch-on and switch-off operations of a pulse-width-modulated signal in the case of symmetrical pulse width modulation, in which the switching edges of two switch-on durations have been shifted to the start and end of the switching period, and FIG. 6 schematically shows one embodiment of an apparatus for pulse width modulation having a control unit.

Corresponding parts and functions are provided with the same reference symbols in all drawings.

DETAILED DESCRIPTION OF INVENTION

Figure 4A:
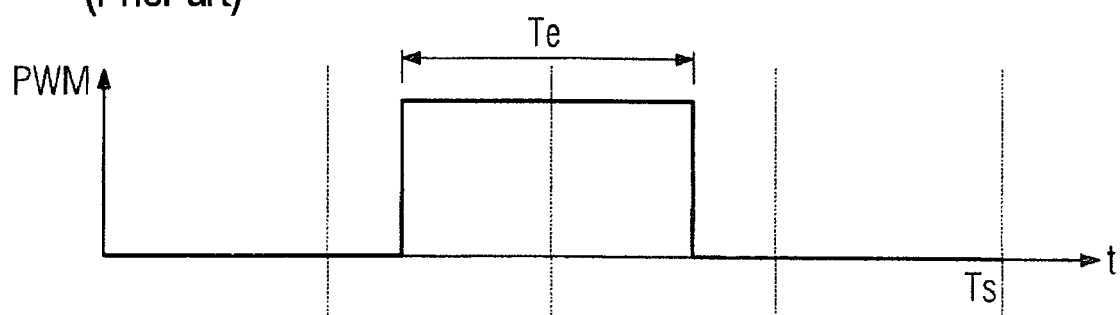
FIGS. 4A to 4C show a plurality of timing diagrams of a discrete sequence of switch-on and switch-off operations of a pulse-width-modulated signal, in which the switching edge of the switch-on duration and/or of the switch-off duration has been shifted by negating the switch-off duration or switch-on duration.

FIG. 1 shows a timing diagram of a discrete sequence of switch-on operations with a switch-on duration Te and switch-off operations with a switch-off duration Ta of a pulse-width-modulated signal PWM in the prior art. The pulse width modulation method on which the timing diagram is based has a predefined switching period Ts. In this case, the pulse width modulation is used to generate the sequence of switch-on operations and switch-off operations with a variable ratio of the switch-on duration Te to the switch-off duration Ta within the switching period Ts. Such a conventional pulse width modulation method is used, for example, in power electronics to drive electrical machines or devices and systems pertaining to consumer electronics.

In order to detect electrical and non-electrical measurement variables at the device to be controlled, for example a DC chopper controller, in a manner that is largely free of the switching operations of the pulse width modulation method, the switching edge for the switch-on duration Te and/or the switch-off duration Ta is determined on the basis of the ratio of the switch-on duration Te to the switch-off duration Ta in the method according to the invention. In this case, the switching edge which is respectively determined is shifted within the predefined switching period Ts. The following FIGS. 2 and 3 show different exemplary embodiments.

FIG. 2 shows a timing diagram of a discrete sequence of switch-on operations and switch-off operations of a pulse-width-modulated signal PWM, in which the switch-on edge of the switch-on duration Te has been shifted to the start of the switching period Ts of the first period Ts and the switch-off edge of the switch-on duration Te has been shifted to the end of the switching period Ts in the second period 2*Ts. In this case, the shift is determined as follows. If the switch-on duration Te is shorter than the switch-off duration Ta and the ratio is thus less than 1 (see period Ts), the switch-on edge of the switch-on duration Te is shifted to the start of the switching period Ts. If the switch-on duration Te is longer than the switch-off duration Ta and the ratio is thus greater than 1, the switching edge for the switch-off duration Ta will be shifted to the start of the switching period Ts (see period 2*Ts). As a result, as shown in FIG. 2, the period of time T1 and thus the second half of the switching period Ts of the first period Ts are free of switching times.

FIG. 3 shows an alternative embodiment. In this case, the timing diagram shows a discrete sequence of switch-on and switch-off operations of a pulse-width-modulated signal PWM, in which the switching edge of the switch-on duration Te has been shifted to the end of the switching period Ts in the first period Ts and the switch-off duration Ta has been shifted to the end of the switching period Ts in the second period 2*Ts. In this case, the shift is determined as follows. If the switch-on duration Te is shorter than the switch-off duration Ta and the ratio is thus less than 1 (see period Ts), the switching edge of the switch-on duration Te is shifted to the end of the switching period Ts. If the switch-on duration Te is longer than the switch-off duration Ta and the ratio is thus greater than 1, the switching edge for the switch-off duration Ta will be shifted to the end of the switching period Ts (see period 2*Ts). As a result, as shown in FIG. 3, the period of time T2 and thus the first half of the switching period Ts of the first period Ts are free of switching times.

Figure 4B:
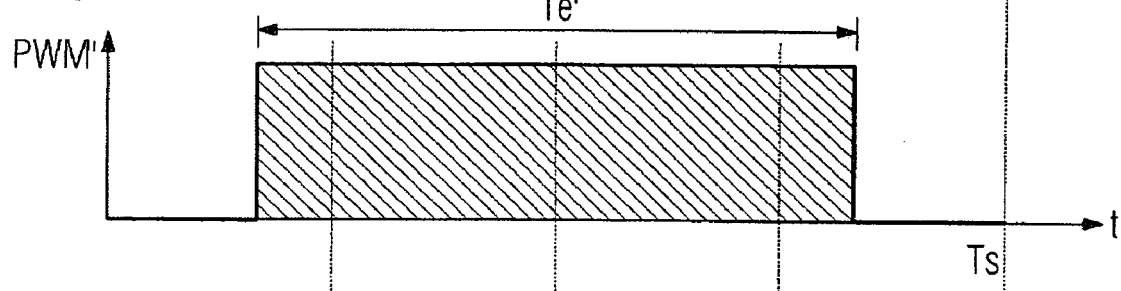
Figure 4C:
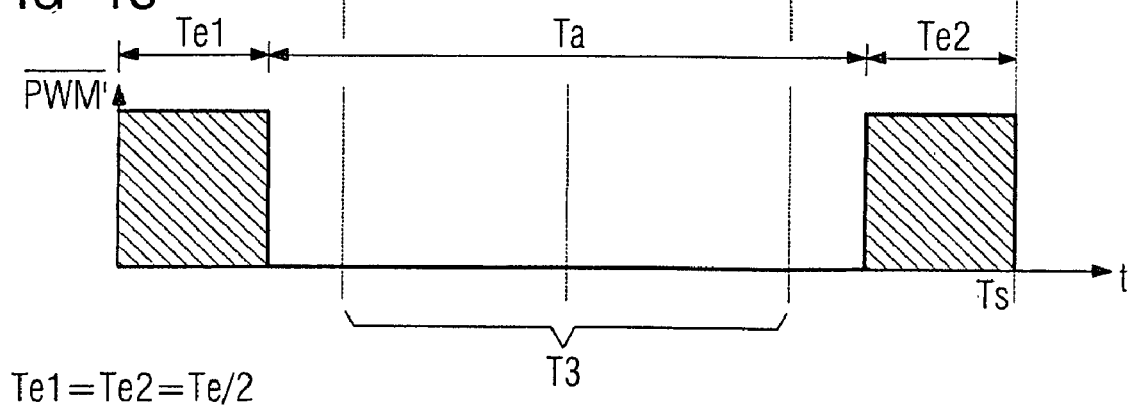

FIGS. 4A to 4C show another exemplary embodiment of the amended pulse modulation method, in which the switching edges for the switch-on and switch-off operations have been shifted by double negation. In this case, FIG. 4A shows a timing diagram with the conventional pulse-width-modulated signal PWM. FIG. 4B shows a pulse-width-modulated signal PWM' which results from a first negation in such a manner that the first negated pulse-width-modulated signal PWM' is formed as follows by setting the pulse width modulation register:

$$PWM'=100\%-PWM.$$

This results in a switch-on duration Te' of the first negated signal PWM' that is longer than the switch-on duration Te of the original signal PWM. FIG. 4C shows the second negated pulse-width-modulated signal $\overline{PWM}'$ which is generated by logically negating the first negated pulse-width-modulated signal PWM' and is generated, for example, by negating the voltage-time integral of the first negated signal PWM'. As a result of this, two switch-on durations Te1 and Te2, whose switch-on edge and switch-off edge are shifted to the start and end of the switching period Ts, respectively, are determined in the exemplary embodiment shown in FIGS. 4B and 4C. A period of time T3 is thus free of switching times in the central region of the switching period Ts.

FIGS. 5A to 5B show a plurality of timing diagrams of a discrete sequence of switch-on and switch-off operations of a pulse-width-modulated signal PWM in the case of symmetrical pulse width modulation, in which the switching edges of two switch-on durations Te have been shifted to the start and end of the switching period Ts. In this case, the switching edges, in particular the switch-on edge of the switch-on duration Te1 and the switch-off edge of the switch-on duration Te2, are shifted in such a manner that the switch-on edge of the switch-on duration Te1 is arranged at the start of the switching period Ts and the switch-off edge of the switch-on duration Te2 is arranged at the end of the switching period Ts and are thus arranged at a distance from one another. This ensures that a period of time T4 which is arranged in the middle of the switching period Ts is free of switching times. In order to shift the switching edges of the switch-on durations Te1 and Te2, an apparatus 1 for pulse width modulation, as illustrated by way of example in FIG. 6, comprises a control unit 2 having a counter module 4 with a counting function F1 which, instead of counting up and then down in the conventional manner, conversely first counts down and then up.

In FIG. 6, the apparatus 1 for pulse width modulation may also comprise corresponding components for the other exemplary embodiments described above, for example a signal generator G, a comparator 6 and a negation means 8, for example an XOR element. The apparatus 1 is, for example, a microprocessor or another suitable data processing unit.

The invention claimed is:

1. A method for pulse width modulation, comprising:
providing a predefined switching period having an adjustable ratio of a switch-on duration to a switch-off duration;
converting a quantized signal into a pulse-width-modulated signal;
generating a discrete pulse sequence of switch-on operations and switch-off operations with the predefined switching period; and
determining a switching-free period of time based on a switching edge for one of said switch durations established with double negation, to allow for detection of electrical and non-electrical measurement variables, that are typically not measurable when interference is present, with minimum interference, based upon a ratio of the switch-on duration to the switch-off duration, wherein the switching-free period of time occurs at a same time within the switching period.

2. The method as claimed in claim 1, wherein the switching edge of the switch-on duration is set at a start of the switching period if the ratio of the switch-on duration to the switch-off duration is less than 1.

3. The method as claimed in claim 1, wherein the switching edge of the switch-off duration is set at an end of the switching period if the ratio of the switch-on duration to the switch-off duration is less than 1.

4. The method as claimed in claim 1, wherein the switching edge of the switch-on duration is set at the end of the switching period if the ratio of the switch-on duration to the switch-off duration is greater than 1.

5. The method as claimed in claim 1, wherein the switching edge of the switch-off duration is set at the start of the switching period if the duty ratio of the switch-on duration to the switch-off duration is greater than 1.

6. The method as claimed in claim 1, wherein the duration of the switch-on duration is replaced with the duration of the switch-off duration or vice versa.

7. The method as claimed in claim 1, wherein the switching edge for the switch-on duration is determined by negating the switch-off operations generated within the switching period.

8. The method as claimed in claim 1, wherein the switching edge for the switch-off duration is determined by negating the switch-on operations generated within the switching period.

9. The method as claimed in claim 1, wherein at least two switch-on durations are predefined within a constant switching period in case of symmetrical pulse width modulation, wherein the switching edges are set at a start and at a end of at least one switching period.

10. The method as claimed in claim 9, wherein a reference signal on which the symmetrical pulse width modulation is based is predefined as a signal which falls from the start of the switching period to a middle of the switching period and rises from a middle of the switching period to the end of the switching period.

11. The method as claimed in claim 10, wherein the reference signal is counting function.

12. An apparatus for pulse width modulation, comprising:
a predefined switching period with an adjustable ratio of a switch-on duration to a switch-off duration; and
a control unit having a negation means to convert a quantized signal into a pulse-width-modulated signal and to generate the pulse-width-modulated signal in a form of a discrete pulse sequence of switch-on operations and switch-off operations with the predefined switching period, wherein a switching edge for one of said switch durations is determined, to allow for detection of electrical and non-electrical measurement variables, that are typically not measurable when interference is present, with minimum interference, based upon a ratio of the switch-on duration to the switch-off duration, wherein the switching-free period of time occurs at a same time within the switching period.

13. The apparatus as claimed in claim 12, wherein the control unit sets the switching edge of the switch-on duration at the start of the switching period if the ratio of the switch-on duration to the switch-off duration is less than 1.

14. The apparatus as claimed in claim 12, wherein the control unit sets the switching edge of the switch-off duration at the end of the switching period if the duty ratio of the switch-on duration to the switch-off duration is less than 1.

15. The apparatus as claimed in claim 12, wherein the control unit sets the switching edge of the switch-on duration at the end of the switching period if the duty ratio of the switch-on duration to the switch-off duration is greater than 1.

16. The apparatus as claimed in claim 12, wherein the control unit sets the switching edge of the switch-off duration at the start of the switching period if the duty ratio of the switch-on duration to the switch-off duration is greater than 1.

17. The apparatus as claimed in claim 12, wherein the control unit determines the switching edge for the switch-on duration by negating the switch-off operations generated within the switching period.

18. The apparatus as claimed in claim 12, wherein the duration of the switch-on duration is replaceable with the duration of the switch-off duration or vice versa.

19. The apparatus as claimed in claim 12, wherein the control unit determines the switching edge for the switch-off duration by negating the switch-on operations generated within the switching period.

20. The apparatus as claimed in claim 12, wherein the control unit predefines at least two switch-on durations within the constant switching period in the case of symmetrical pulse width modulation, wherein the switching edges of the switching durations are set at the start and at the end of at least one or two adjacent switching periods.

* * * * *